(12) United States Patent
Chiang et al.

(10) Patent No.: US 10,269,676 B2
(45) Date of Patent: Apr. 23, 2019

(54) THERMALLY ENHANCED PACKAGE-ON-PACKAGE (POP)

(71) Applicant: Taiwan Semiconductor Manufacturing Company, Ltd., Hsin-Chu (TW)

(72) Inventors: Tsung-Hsien Chiang, Hsin-Chu (TW); Ming Hung Tseng, Toufen Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/644,399

(22) Filed: Oct. 4, 2012

(65) Prior Publication Data

US 2014/0097532 A1    Apr. 10, 2014

(51) Int. Cl.
   *H01L 23/10*    (2006.01)
   *H01L 23/34*    (2006.01)
   (Continued)

(52) U.S. Cl.
   CPC ............ *H01L 23/36* (2013.01); *H01L 23/057* (2013.01); *H01L 23/3672* (2013.01);
   (Continued)

(58) Field of Classification Search
   CPC . H01L 23/36; H01L 23/49827; H01L 23/057; H01L 23/49822; H01L 23/3672; H01L 24/20; H01L 23/49816; H01L 25/0657; H01L 2224/0401; H01L 2224/06181; H01L 2224/131; H01L 2224/04105; H01L 2224/02379;
   (Continued)

(56) References Cited

U.S. PATENT DOCUMENTS 5,268,812 A    12/1993    Conte
5,856,911 A    1/1999    Riley
(Continued)

FOREIGN PATENT DOCUMENTS

JP    2007-329163    * 12/2007

OTHER PUBLICATIONS

Blackshear, E.D., et al., "The Evolution of Build-up Package Technology and its Design Challenges," IBM Journal of Research and Development, Power5 and Packaging, vol. 49, No. 4/5, Jul./Sep. 2005, pp. 641-661.
(Continued)

*Primary Examiner* — Kimberly N Rizkallah
*Assistant Examiner* — Dilinh P Nguyen
(74) *Attorney, Agent, or Firm* — Slater Matsil, LLP

(57) ABSTRACT

A method and structure for providing improved thermal management in multichip and package on package (PoP) applications. A first substrate attached to a second smaller substrate wherein the second substrate is encircled by a heat ring attached to the first substrate, the heat ring comprising heat conducting materials and efficient heat dissipating geometries. The first substrate comprises a heat generating chip and the second substrate comprises a heat sensitive chip. A method is presented providing the assembled structure with increased heat dissipation away from the heat sensitive chip.

20 Claims, 8 Drawing Sheets

(51) Int. Cl.

| | | |
|---|---|---|
| *H01L 21/44* | (2006.01) | |
| *H01L 21/48* | (2006.01) | |
| *H01L 21/50* | (2006.01) | |
| *H01L 23/36* | (2006.01) | |
| *H01L 23/057* | (2006.01) | |
| *H01L 23/367* | (2006.01) | |
| *H01L 23/498* | (2006.01) | |
| H01L 25/065 | (2006.01) | |
| H01L 23/00 | (2006.01) | |

(52) U.S. Cl.
CPC .. *H01L 23/49822* (2013.01); *H01L 23/49827* (2013.01); *H01L 23/49816* (2013.01); *H01L 24/20* (2013.01); *H01L 25/0657* (2013.01); H01L 2224/02379 (2013.01); H01L 2224/0401 (2013.01); H01L 2224/04105 (2013.01); H01L 2224/06181 (2013.01); H01L 2224/12105 (2013.01); H01L 2224/131 (2013.01); H01L 2225/06513 (2013.01); H01L 2225/06517 (2013.01); H01L 2225/06541 (2013.01); H01L 2225/06565 (2013.01)

(58) Field of Classification Search
CPC . H01L 2224/12105; H01L 2225/06565; H01L 2225/06541; H01L 2225/06517; H01L 2225/06513
USPC ............. 257/706, 712, 720, 722, 723, 675, 257/E31.131, E23.051, E23.08; 438/122, 438/123, 125, 107, 109, 110
See application file for complete search history.

(56) References Cited

U.S. PATENT DOCUMENTS

| | | | |
|---|---|---|---|
| 5,947,193 A | 9/1999 | Adkins et al. | |
| 5,990,418 A | 11/1999 | Bivona et al. | |
| 5,990,550 A | 11/1999 | Umezawa | |
| 6,716,676 B2 * | 4/2004 | Chen ................... | H01L 23/3128 257/E23.092 |
| 8,106,497 B2 * | 1/2012 | Brunnbauer et al. ......... | 257/686 |
| 2002/0061665 A1 | 5/2002 | Batinovich | |
| 2003/0020151 A1 | 1/2003 | Chen et al. | |
| 2003/0030968 A1 | 2/2003 | Tsao et al. | |
| 2003/0035269 A1 | 2/2003 | Chiu | |
| 2004/0150116 A1 | 8/2004 | Wang | |
| 2004/0196634 A1 | 10/2004 | Mallik et al. | |
| 2005/0067680 A1 | 3/2005 | Boon et al. | |
| 2005/0110128 A1 | 5/2005 | Ahn et al. | |
| 2007/0187069 A1 | 8/2007 | Ueno et al. | |
| 2008/0001283 A1 * | 1/2008 | Lee ................... | H01L 25/0657 257/712 |
| 2008/0067673 A1 | 3/2008 | Takamatsu et al. | |
| 2010/0148356 A1 | 6/2010 | Tamaki | |
| 2010/0244208 A1 * | 9/2010 | Pagaila ................ | H01L 21/568 257/659 |
| 2011/0068444 A1 * | 3/2011 | Chi ..................... | H01L 21/6835 257/669 |
| 2011/0316147 A1 * | 12/2011 | Shih et al. ..................... | 257/737 |
| 2012/0001927 A1 * | 1/2012 | Tiggs et al. ................... | 345/522 |
| 2012/0020028 A1 | 1/2012 | Bachman et al. | |
| 2012/0049347 A1 | 3/2012 | Wang | |
| 2012/0049364 A1 * | 3/2012 | Sutardja ................ | H01L 24/24 257/738 |
| 2012/0087090 A1 | 4/2012 | Feng et al. | |
| 2012/0098123 A1 | 4/2012 | Yu et al. | |
| 2013/0009175 A1 * | 1/2013 | Hsu ..................... | H01L 25/0756 257/88 |
| 2013/0093073 A1 * | 4/2013 | Chen et al. .................... | 257/686 |
| 2013/0138894 A1 * | 5/2013 | Loh ..................... | G06F 12/0888 711/144 |
| 2013/0182402 A1 * | 7/2013 | Chen ................ | H01L 23/49827 361/807 |
| 2014/0015106 A1 | 1/2014 | Hsieh et al. | |

OTHER PUBLICATIONS

Linder, S., et al., "Fabrication Technology for Wafer Through-Hole Interconnections and Three-Dimensional Stacks of Chips and Wafers," IEEE International Conference on Micro Electro Mechanical Systems, MEMS '94, Jan. 1994, Oiso, Japan, pp. 349-354.
Ritchey, L.W., "Anatomy of a Plated Through Hole," Copyright, Speeding Edge, Aug. 30, 2001, 5 pages.

* cited by examiner

THERMALLY ENHANCED PACKAGE-ON-PACKAGE (POP)

BACKGROUND

As the demand for smaller electronic products grows, manufacturers and others in the electronics industry continually seek ways to reduce the size of integrated circuits used in electronic products. In that regard, three-dimensional type integrated circuit packaging techniques have been developed and used.

One packaging technique that has been developed is Package-on-Package (PoP). As the name implies, PoP is a semiconductor packaging innovation that involves stacking one package on top of another package. A PoP device may combine vertically discrete memory and logic ball grid array (BGA) packages. In PoP package designs, the top package may be interconnected to the bottom package through peripheral solder balls.

Applications for such multiple chip packages are numerous. Because certain types of dedicated devices are commonly used, it is often needed to put these devices together to complete a functional design for a particular use. Combining microprocessor devices with program memory storage such as FLASH or EEPROM devices, combining microprocessors with application specific processors, such as baseband transceivers, graphics processors, cache memory devices, memory management devices, and analog to digital converters, are all useful and commonly used arrangements that provide applications for the structures described herein.

Such multiple chip packages often exhibit thermal coupling between packages. The performance of many devices is sensitive to temperature and can become degraded as temperature increases. Additionally, many processing units, such as accelerated processing units (APUs), are heat generators. Thus the application of multiple chip packages requires added consideration of the thermal management with regards to the thermal coupling between chip components and between chip packages.

BRIEF DESCRIPTION OF THE DRAWINGS

For a more complete understanding, various embodiments and the advantages thereof are presented. Reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In order to address the thermal coupling common in multiple chip or package systems, the following embodiments demonstrate an apparatus for reducing thermal energy in such systems. Various designs of heat rings are presented in the embodiments shown. The embodiments of the heat rings are intended to demonstrate useful embodiments for thermal energy reduction in multi-chip and multi-package systems in order to provide improved performance for thermally sensitive systems (such as memory chips).

Figure 1:
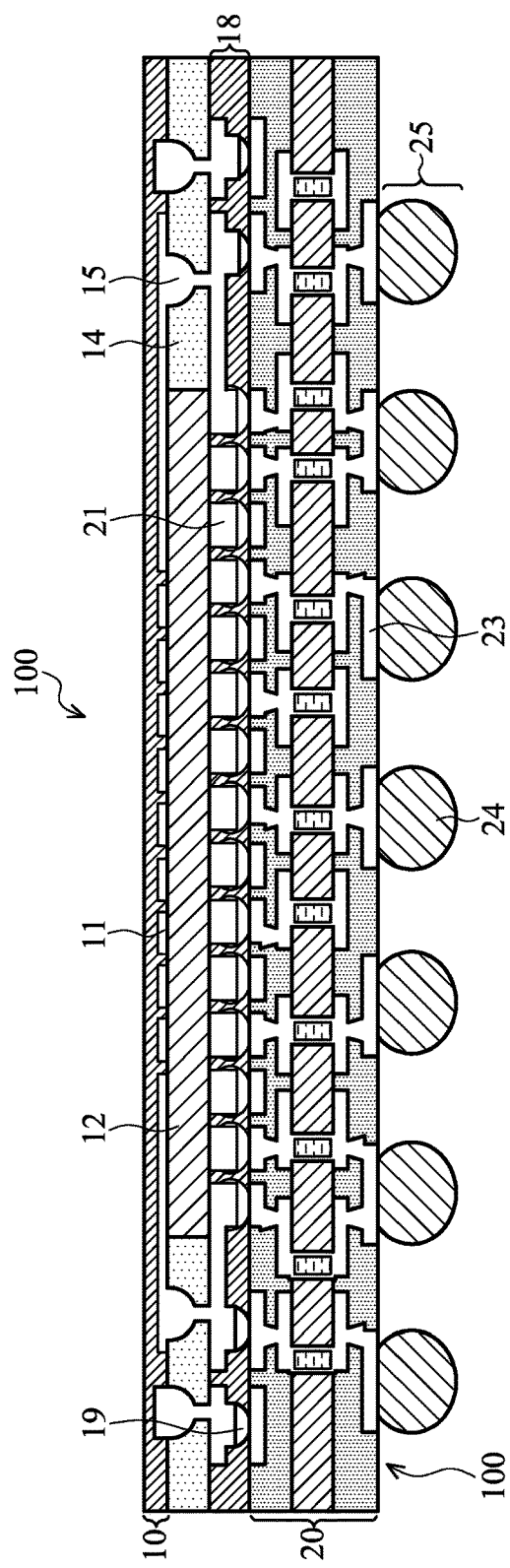
FIG. 1 depicts a cross-sectional view of a bottom package in accordance with an embodiment.

FIG. 1 depicts a bottom package 100 in accordance with an embodiment. The bottom package 100 comprises an upper redistribution layer (RDL) 10, an integrated circuit die 12, such as an accelerated processing unit (APU), surrounded by molding compound 14, a lower RDL 18, and a substrate 20. The upper RDL 10 includes solder ball lands 11 arranged to receive a top package (not shown), such as another substrate, a die, a package, or the like. The upper RDL 10 provides an electrical connection from the solder ball lands 11 to through vias 15, wherein the through vias 15 may comprise various via types, such as through molding vias (TMVs) or through assembly vias (TAVs). The through vias 15 provide electrical connections through the molding compound 14 to the lower RDL 18. The lower RDL 18 provides an electrical connection between the through vias 15 and the integrated circuit die 12, and/or between the through vias 15 and contacts on the substrate 20. The solder bump lands 21 connect the lower RDL 18 to the substrate 20 through solder bumps 19.

In an embodiment, the substrate 20 comprises a 1-2-1 laminate substrate as illustrated in FIG. 1. In this embodiment, the substrate 20 may comprise one or more layers wiring on each side of a two metal core connecting the lower RDL 18 to ball lands 23 positioned on an opposing side of the lower RDL 18. In other embodiments, the substrate 20 may comprise a different type of substrate, such as an interposer, a silicon interposer, an organic substrate, or the like.

Solder balls 24 provide a means of connecting the bottom package 100 to one or more additional substrates and may be arranged, for example, as a ball grid array (BGA) 25.

It should be noted that the description of the bottom package 100 described above is provided for illustrative purposes only and that other structures/devices may be substituted for the bottom package 100. For example, the bottom package 100 is not limited to the embodiments illustrated herein, but rather the bottom package 100 may comprise substrates, interposers, and or the like.

In embodiments such as those discussed above, a significant amount of heat may be generated. For example, in an embodiment in which the integrated circuit die 12 comprises an APU, the integrated circuit die 12 may generate a significant amount of heat. As the demand and the performance of the integrated circuit die 12 increases, so does the amount of heat generated. This heat then transfers throughout the bottom package 100 and into other attached components, such as dies, substrates, packages, or the like, and may adversely affect the performance of the attached components. The integrated circuit die 12 shown could also be any other type of die and is not limited to an APU.

Figure 2:
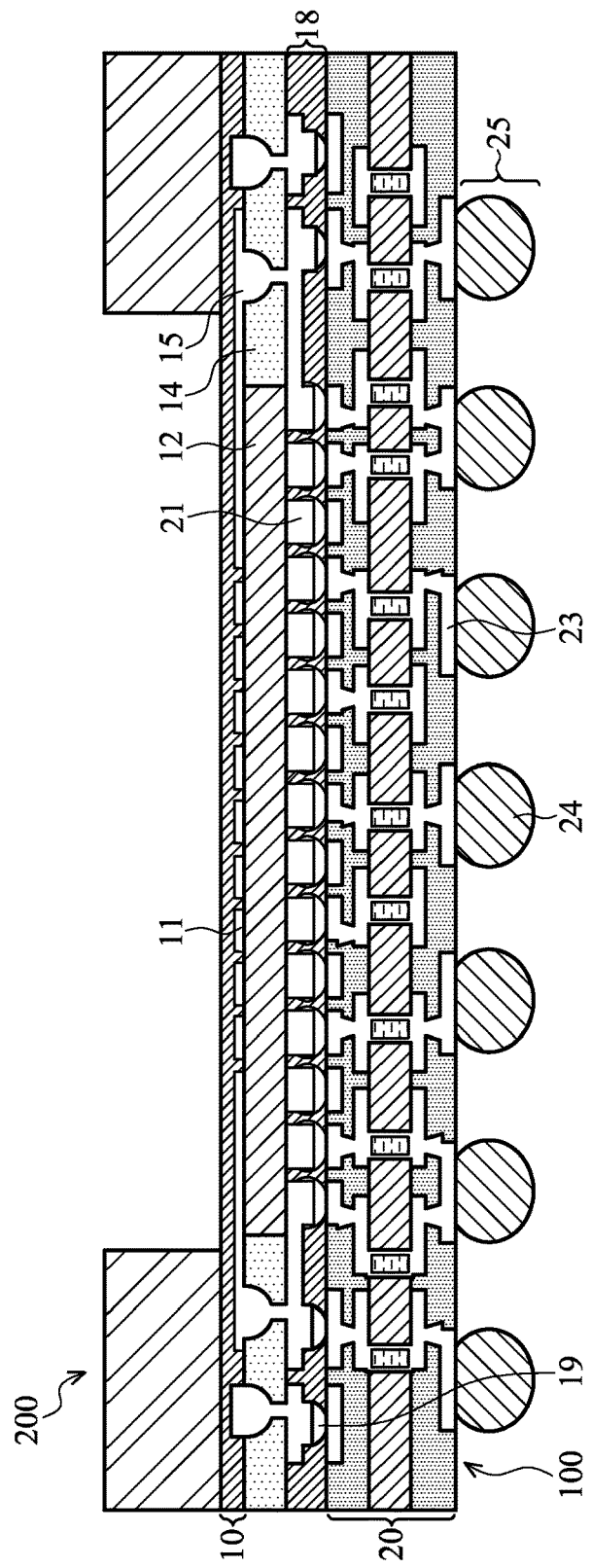
FIG. 2 depicts a cross-sectional view of the bottom package with a heat ring in accordance with an embodiment.

FIG. 2 depicts a cross-section view of the bottom package 100 after attaching or forming a heat ring 200 in accordance with an embodiment. In particular, the embodiment includes the bottom package 100, as depicted and described in FIG. 1, having the heat ring 200 attached thereto. The heat ring 200 comprises one or more heat conducting materials and is intended to transfer heat away from the bottom package 100 and any other substrate or other component (e.g., the APU) attached to the bottom package 100. In an embodiment the heat ring 200 comprises a metal such as silver, copper, aluminum, gold, or another thermal conducting metal. In another embodiment the heat ring 200 comprises a non-metal such as a composite polymer or diamond. The heat ring 200 is placed in a region surrounding solder ball lands 11 such that the heat ring 200 will surround a device attached to the solder ball lands 11 as discussed in further detail below.

Figure 3:
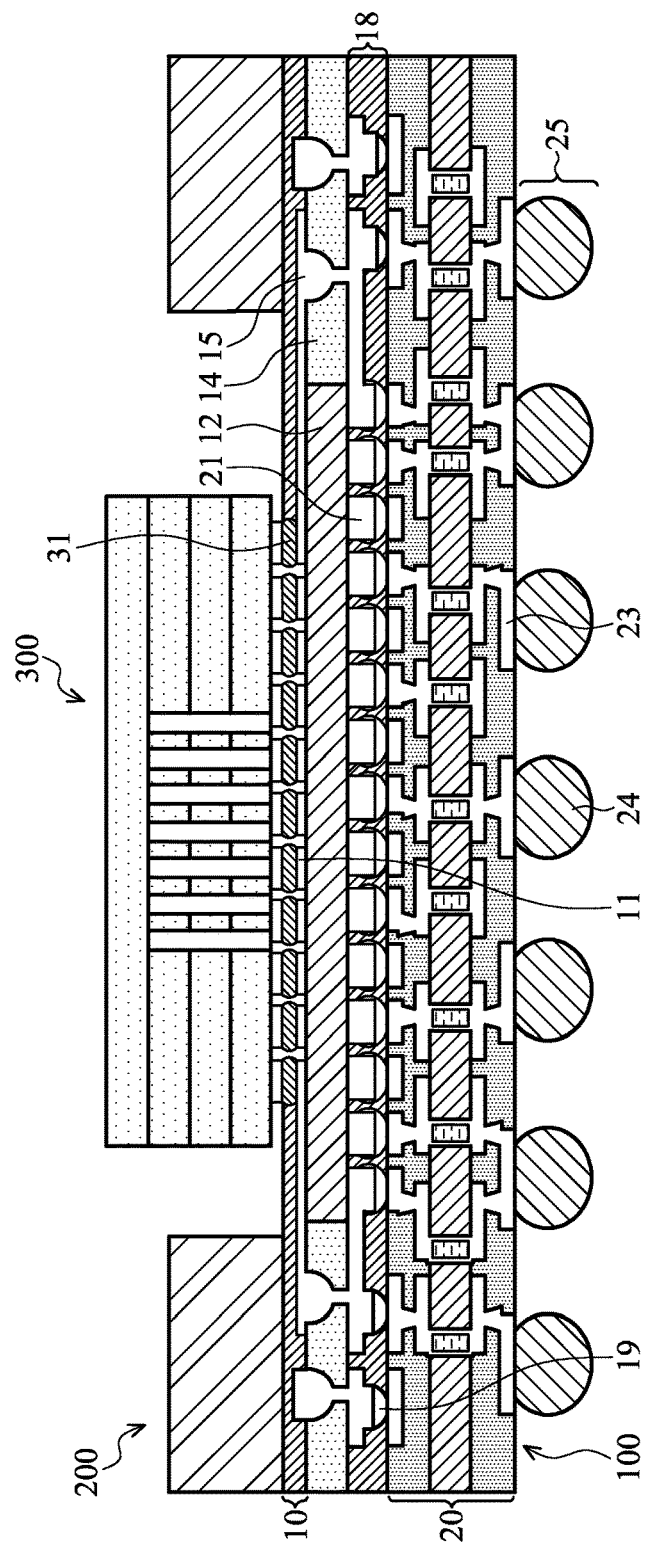
FIG. 3 depicts a cross-sectional view of a package-on-package in accordance with an embodiment.

FIG. 3 depicts an embodiment wherein a top package 300 is attached to the bottom package 100 and surrounded by the heat ring 200. The top package 300 is attached through solder balls 31 at the solder ball lands 11 to the bottom package 100. However, other suitable types of connections, such as Cu/SnAg pillar bumps or bump on trace joints, may alternatively be utilized. In an embodiment the top package 300 comprises a memory chip. In a further embodiment the top package 300 comprises a memory chip stack with multiple memory chips. In other embodiments, however, the top package 300 may comprise one or more dies, packages, substrates, or the like.

In an embodiment in which the bottom package 100 comprises an APU and the top package 300 comprises a memory chip stack with one or more memory chips, the APU may generate a significant amount of heat. The performance of the memory chip stack is related to temperature, and at high temperatures, the performance of the memory chip stack may be degraded. Thus, the placement of a heat generating component (e.g., the APU) near the memory chip stack is not beneficial from a thermal management perspective; however, the integration density is increased in this type of configuration, thus making the configuration desirable. In order to resolve this conflict between device integration and thermal dissipation the heat ring 200 is provided. As illustrated in FIG. 3, the top package 300 (e.g., the memory chip stack) is smaller than the bottom package 100, thereby providing a space on the surface of the bottom package 100 in the area surrounding the top package 300 where thermally dissipating structures (e.g., the heat ring 200) can be attached. The heat ring 200 provides a means of transferring the thermal energy generated by the APU away from the memory chip stack. This allows the memory chip stack to be attached near the heat generating APU without the degraded performance caused by high temperatures.

In the embodiment shown, the bottom package 100 has a ball grid array 25 on the bottom surface which can be attached to further dies, substrates, or packages. Thus, the embodiment shown can be a complete system or a part of a larger system with multiple substrates or packages attached below the bottom package 100. In another embodiment, the bottom package 100 may comprise any type of heat generating chip and is not limited to an APU.

In an embodiment the heat ring 200 comprises a continuous ring that completely encircles the top package 300. In another embodiment the ring may be broken into sections with small gaps between heat dissipating structures. In an embodiment the heat ring 200 will cover the entire surface of the bottom package 100 up to the area occupied by the substrate 300. Generally the heat ring will not physically touch the top package 300 because the purpose of the heat ring is to dissipate heat generated by the bottom package 100 away from the top package 300. Physical contact from the heat ring 200 to the top package 300 may cause heat to be transferred to the top package 300. In another embodiment the heat ring 200 may only cover a portion of the area on the surface of bottom package 100 encircling the top package 300.

Figure 4A:
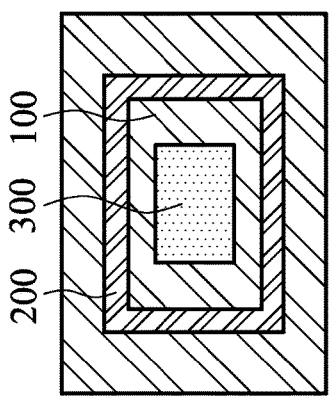
FIGS. 4a-4d depict top views of possible heat ring configurations in accordance with various embodiments.
Figure 4B:
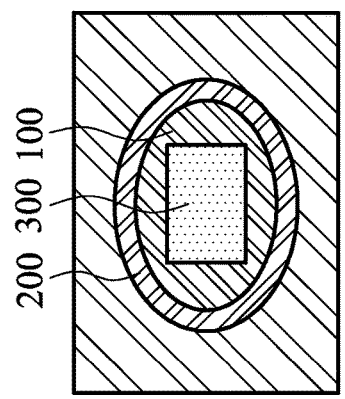
Figure 4C:
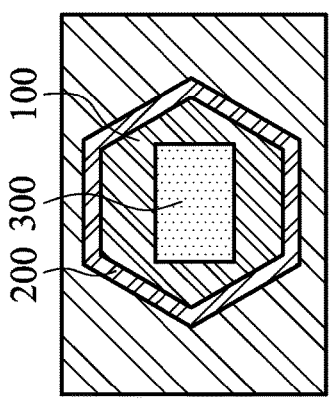
Figure 4D:
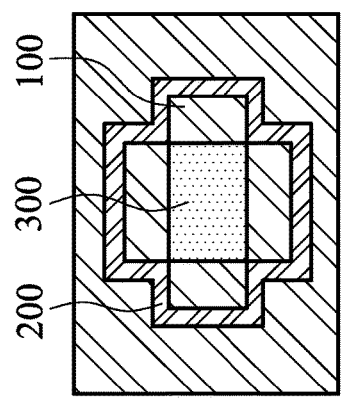

FIGS. 4a-4d depict top views of potential heat ring configurations. In the figures a heat ring 200 comprising various shapes is attached to the bottom package 100 in an area on the surface of the bottom package 100 surrounding the top package 300 which is also attached to the bottom package 100. FIG. 4a depicts a rectangular heat ring 200. FIG. 4b depicts an oval heat ring 200. FIG. 4c depicts a hexagonal heat ring 200. FIG. 4d depicts a plus shaped heat ring 200. In an embodiment the top package 300 is a packaged device such as the memory chip stack mentioned earlier and the bottom package 100 comprises an APU. In another embodiment the top package 300 is a part of many dies stacked vertically and the heat ring 200 is only a layer in the stack, attached to another substrate on top and the bottom package 100 on the bottom. The bottom package 100 could then be attached to further substrates below.

Figure 5:
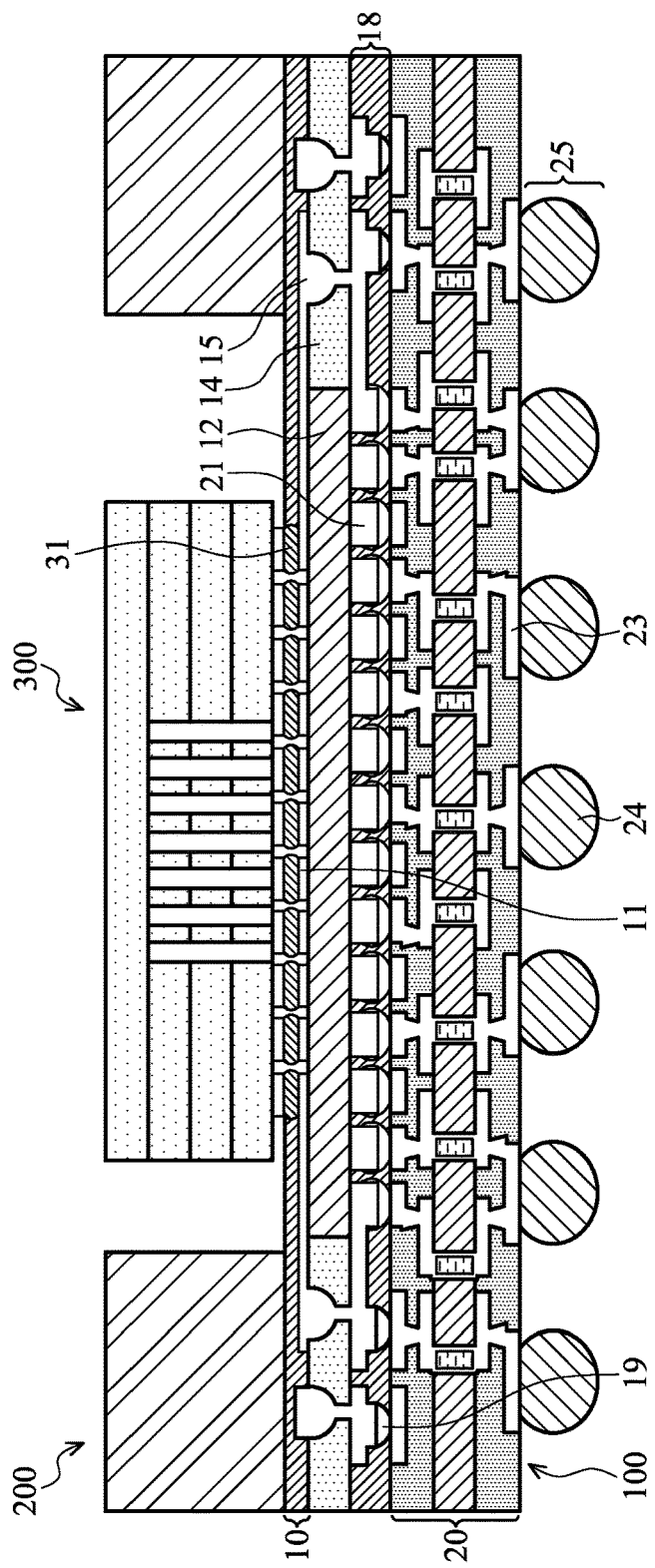
FIG. 5 depicts a cross-sectional view of a package-on-package in accordance with another embodiment.

FIG. 5 depicts a further embodiment where in a heat ring 200 extends to the same height as an upper surface of the top package 300. The embodiment comprises the bottom package 100 attached to the top package 300 through the use of solder balls 31. The top package 300 is encircled by the heat ring 200. The top package 300 and the heat ring 200 are of the same height, as opposed to the heat ring 200 having a lesser height as depicted in FIG. 3. In an embodiment the top surfaces of the top package 300 and the heat ring 200 could then be attached to another substrate. In another embodiment the top surfaces of the top package 300 and the heat ring 200 could then be attached to a packaging structure.

Figure 6:
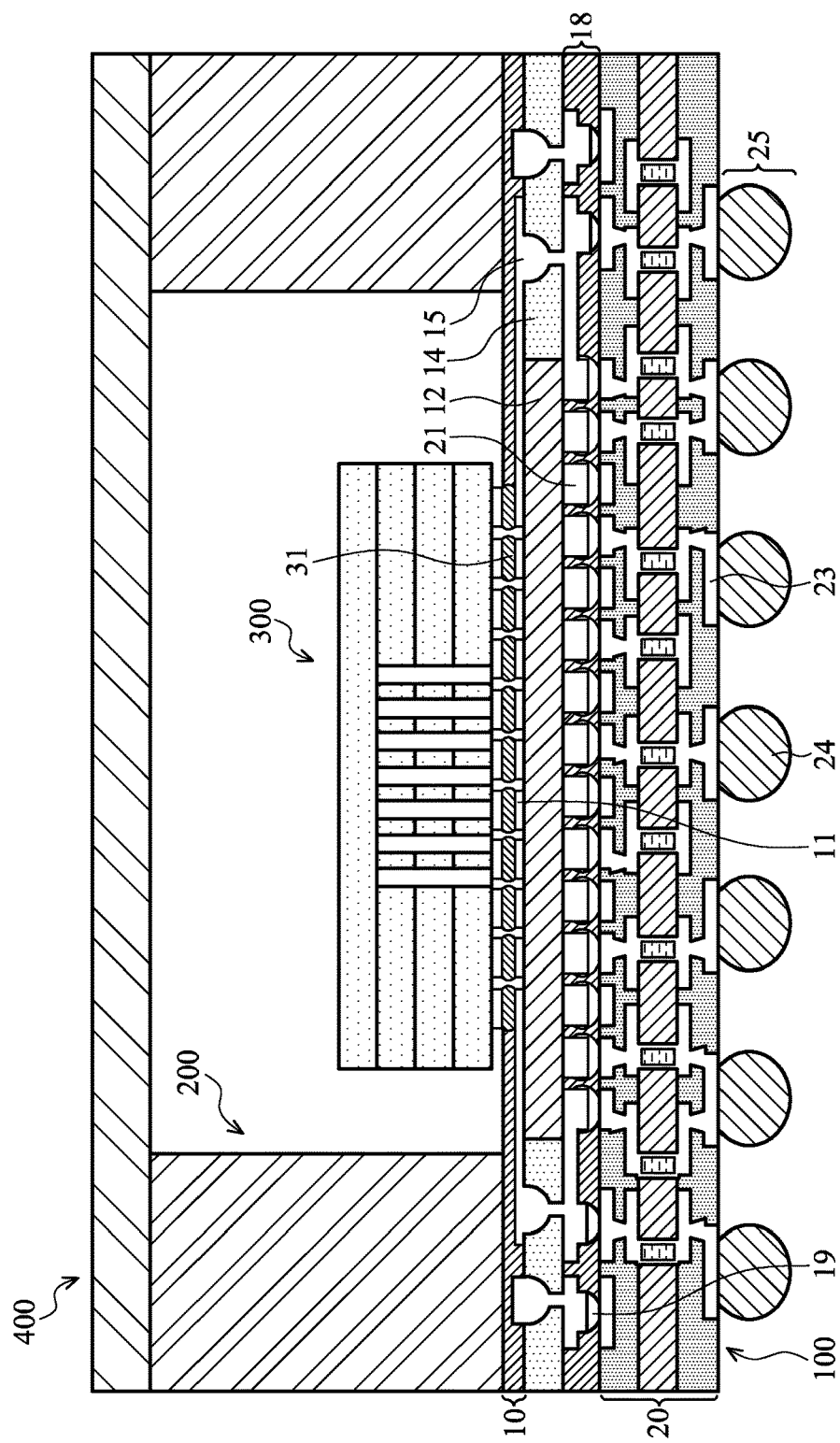
FIG. 6 depicts a cross-sectional view of a package-on-package in accordance with another embodiment.

FIG. 6 depicts an embodiment comprising the heat ring 200 attached to the bottom package 100 and extending above an upper surface of the top package 300. The top package 300 is attached to the bottom package 100 through the solder balls 31. The heat ring 200 extends to a structure 400. Structure 400 could comprise another substrate wherein the substrate 400 is formed on or attached to a top surface of the heat ring 200. In an alternative embodiment structure 400 could comprise a chip package surface to which a top surface of the heat ring 200 is attached. In another embodiment the bottom package 100 and the top package 300 could comprise packaged chips and the heat ring 200 could extend and attach to the outer device housing 400, such as a the outer housing or casing of the specific application such as a cell phone housing, a computer case, a camera housing, or the like. In this particular embodiment the heat ring 200 is providing a path for thermal dissipation to an interface with the external environment.

Figure 7:
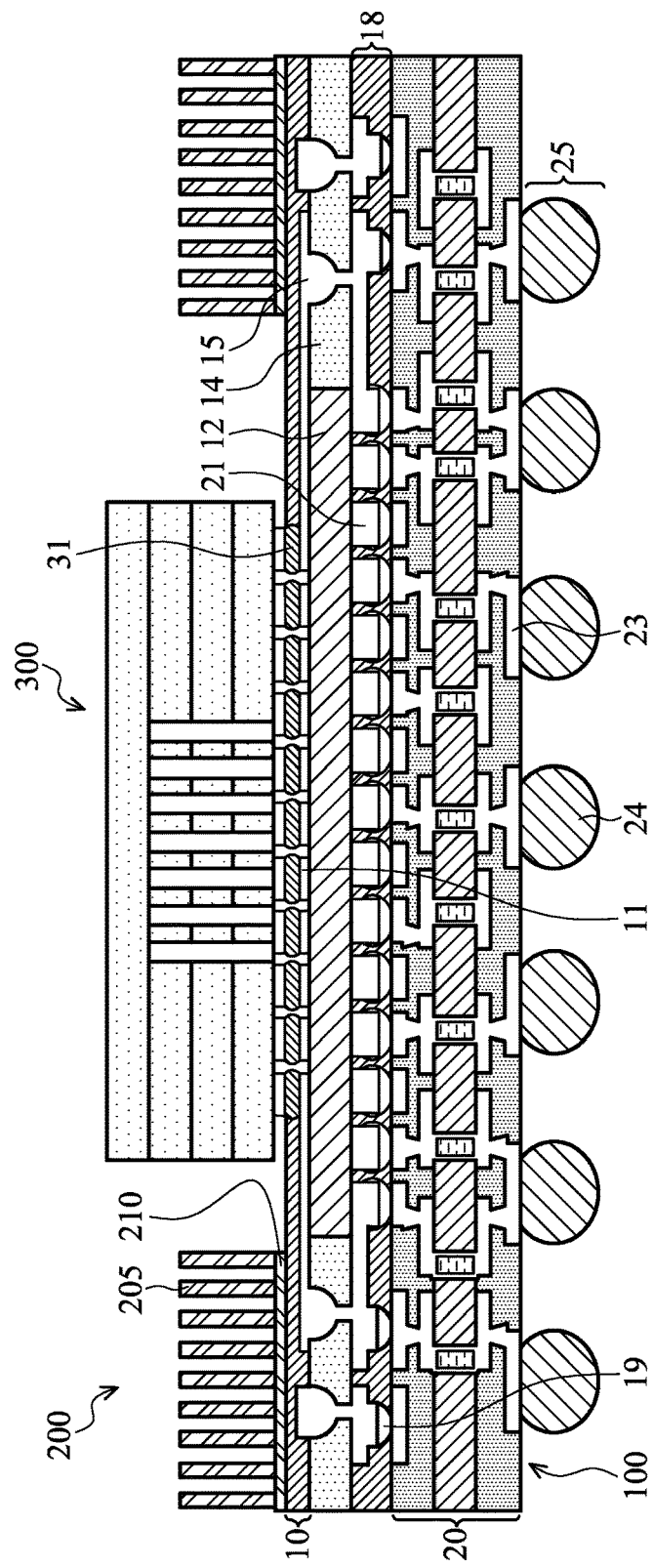
FIG. 7 depicts a cross-sectional view of a package-on-package in accordance with an embodiment.

FIG. 7 depicts an embodiment wherein the heat ring 200 comprises a fin like structural design. The embodiment comprises the bottom package 100 attached to the top package 300 through solder balls 31. The heat ring 200 is also attached to the bottom package 100. Rather than having a solid cross-section as depicted in FIGS. 1-3, however, the heat ring 200 is shown to have multiple heat dissipating fins 205. The fins 205 provide increased surface area compared to a solid cross-section. The heat dissipating fins 205 are attached to a baseplate 210. The baseplate 210 is attached to the bottom package 100.

Figure 8B:
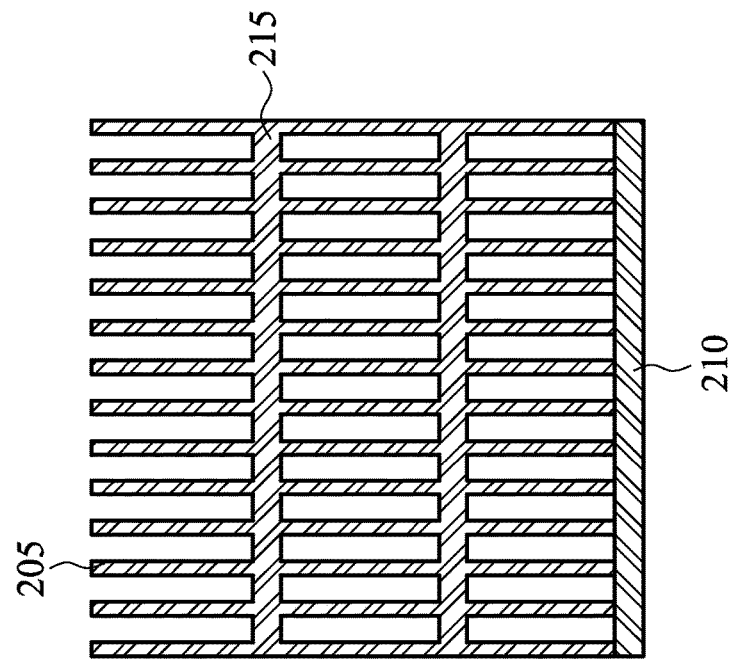
FIGS. 8a and 8b depict cross-sectionals views various heat ring structures in accordance with various embodiments.
Figure 8A:
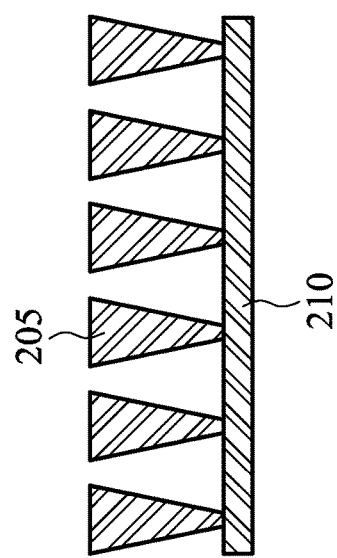

FIGS. 8a-8b depict cross-sectional views of other potential heat ring designs. FIG. 8a depicts a heat ring 200 comprising fins 205 attached to a baseplate 210, wherein the fins 205 spread outward as the fins 205 extend away from the baseplate 210. The fins 205 have increased surface area over the purely vertical fins depicted in FIG. 7. FIG. 8b depicts a heat ring 200 comprising multiple levels of fins 205. The fins 205 are connected to a baseplate 210 on the bottom surface. The intermediate fins 205 are connected to intermediate plates 215. The top level fins 205 are connected to the intermediate plate 215 at a base of the fin and are unconnected at a top of the fin.

In a method for forming an embodiment, a heat ring in various structural designs and sizes may be formed separately in a mold or cast. A bottom substrate will be formed from a known method involving steps such as etching, deposition, metallization, substrate bonding, etc. The heat ring may then be attached through a thermally conducting adhesive to a surface of the bottom substrate. In an embodiment a top substrate, smaller than the bottom substrate will be attached to the surface of the bottom substrate before the heat ring and the heat ring will surround the top substrate once the heat ring is attached. In another embodiment the top substrate will be attached to the surface of the bottom substrate after the heat ring is attached. In an alternative embodiment, the heat ring may be attached to a surface of the top substrate. The heat ring may then be attached, with the top substrate, to the surface of the bottom substrate.

In an embodiment, a device comprising a first substrate, a second substrate, and a heat ring if provided. The second substrate is electrically coupled to the first substrate such that a first portion of the first substrate extends laterally beyond edges of the first substrate. The heat ring is coupled to the first substrate in the first portion.

In another embodiment, another device comprising a first structure having a first die, a second structure having a second die and coupled to the first structure, and a heat dissipating structure connected to a same surface of the first structure is provided.

In yet another embodiment, a method of forming a device is provided. The method comprises providing a first substrate and a second substrate. The first substrate is attached to the second substrate. A heat dissipating structure is attached to a same surface of the first substrate as the second substrate.

Although exemplary embodiments and their advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the structures, methods, and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A device comprising:
   a first substrate comprising:
      a semiconductor die with external connections;
      a first redistribution layer on a first side of the semiconductor die;
      a second redistribution layer on a second side of the semiconductor die and in physical contact with the external connections;
      vias electrically connecting the first redistribution layer and the second redistribution layer, wherein the vias are laterally removed from the semiconductor die and extend from a first side of an encapsulant to a second side of the encapsulant, wherein each via of the vias has a height that is at least as large as a height of the encapsulant and wherein at least one of the vias electrically connects a first surface of the semiconductor die to the first redistribution layer, the first surface being an external surface and facing away from the first redistribution layer;
   a second substrate directly physically coupled to the first redistribution layer and in electrical connection with the semiconductor die through the vias, wherein a first portion of the first substrate extends laterally beyond edges of the second substrate, wherein the second substrate is electrically coupled to the first substrate through a second surface facing the first substrate; and
   a heat ring coupled to a third surface of the first substrate in the first portion, wherein the second substrate comprises a fourth surface facing away from the first substrate that is uncovered by the heat ring, wherein the heat ring extends above a height of the second substrate.

2. The device according to claim 1, wherein the heat ring extends and is thermally coupled to a casing.

3. The device according to claim 1, wherein the heat ring comprises a solid structure.

4. The device according to claim 1, wherein the heat ring comprises one or more layers of fins.

5. The device according to claim 1, wherein the first substrate comprises the semiconductor die laterally encased in the encapsulant and one or more vias extending through the encapsulant.

6. The device according to claim 5, wherein the die comprises an accelerated processing unit (APU).

7. The device according to claim 1, wherein the first substrate comprises a first package and the second substrate comprises a second package.

8. The device according to claim 1, wherein the first substrate comprises an interposer.

9. The device according to claim 1, wherein the second substrate is a semiconductor die.

10. A device comprising:
    a first structure comprising a first die, a first redistribution layer, and a second redistribution layer opposite the first die from the first redistribution layer, wherein the first die is electrically connected to the second redistribution layer through an external surface of the first die facing away from the first redistribution layer, and wherein the first die extends fully between the first redistribution layer to the second redistribution layer;
    vias extending between the first redistribution layer and the second redistribution layer, wherein the vias extend through an encapsulant, the encapsulant extending between the first redistribution layer and the second redistribution layer, the first die being electrically connected to the first redistribution layer through the vias, the encapsulant having a surface that is coplanar with the external surface of the first die, the external surface intersecting a sidewall that is parallel with a longitudinal axis of the vias;

a second structure comprising a second die, the second structure electrically coupled to the first structure through electrical contacts located between the first die and the second die; and a heat dissipating structure mechanically connected to a same surface of the first structure as the second structure and physically separated from the second structure, wherein the second structure has a top surface that does not face the heat dissipating structure, wherein the heat dissipating structure extends away from the first structure a further distance than the second structure.

11. The device according to claim 10, wherein the heat dissipating structure extends and is thermally coupled to a casing.

12. The device according to claim 10, wherein the heat dissipating structure comprises a solid structure.

13. The device according to claim 10, wherein the heat dissipating structure comprises one or more layers of heat dissipating fins.

14. The device according to claim 10, wherein the first die is electrically coupled to an interposer.

15. The device according to claim 10, wherein the device is a package-on-package.

16. The device according to claim 10, wherein the electrical contacts comprise solder.

17. A method comprising:

providing a first substrate comprising a first die and vias electrically connected to the first die through a first redistribution layer, wherein the vias extend fully through an encapsulant and between the first redistribution layer and a second redistribution layer, wherein the first die is a single die that extends fully between the first redistribution layer and the second redistribution layer;

providing a second substrate;

attaching the first substrate to the second substrate such that the second substrate has a first surface facing the first die, and wherein the first die, the first redistribution layer, at least one of the vias, the second redistribution layer, external connections located on the first surface, and the second substrate are in electrical series with each other in this order; and providing a heat dissipating structure attached to a same surface of the first substrate as the second substrate is attached and the heat dissipating structure is located over the vias, wherein the second substrate has a top surface uncovered by the heat dissipating structure, wherein the heat dissipating structure is different from the second substrate.

18. The method according to claim 17, wherein the heat dissipating structure encircles the second substrate.

19. The method according to claim 17, wherein the heat dissipating structure comprises a metal.

20. The method according to claim 17, wherein the first substrate and the second substrate are part of a package-on-package.

* * * * *